(12) United States Patent
Lu et al.

(10) Patent No.: US 9,349,939 B2
(45) Date of Patent: May 24, 2016

(54) ETCH-RESISTANT PROTECTIVE COATING FOR A MAGNETIC TUNNEL JUNCTION DEVICE

(71) Applicant: QUALCOMM Incorporated, San Diego, CA (US)

(72) Inventors: Yu Lu, San Diego, CA (US); Chando Park, San Diego, CA (US); Wei-Chuan Chen, Taipei (TW)

(73) Assignee: Qualcomm Incorporated, San Diego, CA (US)

( * ) Notice: Subject to any disclaimer, the term of this patent is extended or adjusted under 35 U.S.C. 154(b) by 1 day.

(21) Appl. No.: 14/286,518

(22) Filed: May 23, 2014

(65) Prior Publication Data
US 2015/0340593 A1 Nov. 26, 2015

(51) Int. Cl.
| H01L 43/02 | (2006.01) |
|---|---|
| H01L 43/08 | (2006.01) |
| H01L 43/12 | (2006.01) |
| H01L 27/22 | (2006.01) |

(52) U.S. Cl.
CPC ............... *H01L 43/02* (2013.01); *H01L 43/08* (2013.01); *H01L 43/12* (2013.01); *H01L 27/222* (2013.01)

(58) Field of Classification Search
CPC ......... H01L 43/02; H01L 43/08; H01L 43/12; H01L 27/22

USPC ............... 257/423, 421; 438/3, 238, 624
See application file for complete search history.

(56) References Cited

U.S. PATENT DOCUMENTS

| 4,563,253 | A  | * | 1/1986  | Leidheiser et al. | 205/171 |
|---|---|---|---|---|---|
| 6,960,510 | B2 | * | 11/2005 | Deshpande et al. | 438/286 |
| 6,985,384 | B2 |   | 1/2006  | Costrini et al.   |         |
| 7,112,454 | B2 | * | 9/2006  | Drewes et al.     | 438/3   |
| 7,989,224 | B2 |   | 8/2011  | Gaidis            |         |
| 8,143,683 | B2 |   | 3/2012  | Wang et al.       |         |
| 8,208,290 | B2 |   | 6/2012  | Rao et al.        |         |
| 8,574,928 | B2 |   | 11/2013 | Satoh et al.      |         |
| 2008/0024937 | A1 | * | 1/2008  | Gill et al.       | 360/322 |
| 2010/0109106 | A1 | * | 5/2010  | Zhong et al.      | 257/421 |
| 2010/0117169 | A1 |   | 5/2010  | Anderson et al.   |         |
| 2010/0178714 | A1 |   | 7/2010  | Cho et al.        |         |
| 2010/0276768 | A1 | * | 11/2010 | Gaidis            | 257/421 |
| 2010/0289098 | A1 | * | 11/2010 | Li et al.         | 257/421 |
| 2011/0235217 | A1 | * | 9/2011  | Chen et al.       | 360/324.2 |

OTHER PUBLICATIONS

International Search Report and Written Opinion for International Application No. PCT/US2015/030013, ISA/EPO, Date of Mailing Aug. 5, 2015, 11 pages.

* cited by examiner

*Primary Examiner* — Sheng Zhu
(74) *Attorney, Agent, or Firm* — Toler Law Group, PC

(57) ABSTRACT

A method of forming a magnetic tunnel junction (MTJ) device includes forming a spacer on an exposed side portion of the MTJ device. The method further includes forming an etch-resistant protective coating associated with the MTJ device. The etch-resistant protective coating provides greater etch resistance than the spacer.

29 Claims, 6 Drawing Sheets

ETCH-RESISTANT PROTECTIVE COATING FOR A MAGNETIC TUNNEL JUNCTION DEVICE

I. FIELD

The present disclosure is generally related to fabrication of devices, such as fabrication of magnetic tunnel junction devices.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. The executable instructions may be stored in a memory, such as a magnetoresistive random access memory (MRAM).

An MRAM may include magnetic tunnel junction (MTJ) devices. A two-step or multiple-step etch process may be used in forming an MTJ device to achieve some advantageous device attributes including but not limited to preventing redeposition material (e.g., non-volatile etch byproduct) from creating a shunting path between portions of the MTJ device (e.g., between an active tunnel barrier region and a conductive hard mask). A first etching process is applied to define (or "etch out") the conductive hard mask and a top electrode of the MTJ device. A masking process is then performed, including forming a spacer (e.g., a dielectric material) on an exposed sidewall of the MTJ device. Spacer defined multiple-step etching is often used to achieve high packing density and/or small bit-cells within an MTJ array. A second etching process is applied to form a tunnel barrier region and a bottom electrode of the MTJ device.

The spacer often includes materials such as silicon nitrides or silicon oxides that are not resistant to etching processes used to define MTJ devices. As such, the spacer may partially wear as the second etching process is performed. The worn spacer may enable redeposition material to come in close proximity to or to contact the active tunnel barrier, the conductive hard mask, and/or another portion of the MTJ device, thereby forming a second shunting path, which can cause poor performance or inoperability of the MTJ device.

III. SUMMARY

During formation of a magnetic tunnel junction (MTJ) device, a spacer may be formed on an exposed side portion of the MTJ device. For example, the spacer may be formed on the exposed side portion after performing an etch process that exposes the side portion. The spacer may protect the MTJ device from redeposition byproduct resulting from subsequent etching during formation of other portions of the MTJ device. An etch-resistant protective coating associated with the MTJ device may be formed. For example, the etch-resistant protective coating may be formed on the spacer by forming a protective crown and/or by forming a protective layer on the spacer, or the spacer may be implanted with material to form the etch-resistant protective coating. The etch-resistant protective coating provides greater etch resistance to the subsequent etching than the spacer.

In a particular embodiment, a method of forming a magnetic tunnel junction (MTJ) device includes forming a spacer on an exposed side portion of a MTJ device during formation of the MTJ device. The method further includes forming an etch-resistant protective coating associated with the MTJ device during formation of the MTJ device.

In another particular embodiment, an apparatus includes an electrode of a magnetic tunnel junction (MTJ) device and a storage layer of the MTJ device. The MTJ device is formed using a process. The process includes forming a spacer on an exposed portion of the electrode and on an exposed side portion of the storage layer. The process further includes forming an etch-resistant protective coating associated with the MTJ device.

In another particular embodiment, a non-transitory computer readable medium includes instructions that, when executed by a processor, cause the processor to initiate operations. The operations include forming a spacer on an exposed side portion of a magnetic tunnel junction (MTJ) device during formation of the MTJ device. The operations further include forming an etch-resistant protective coating associated with the MTJ device during formation of the MTJ device.

In another particular embodiment, a method includes receiving a data file. The data file includes design information corresponding to a semiconductor device. The method further includes fabricating the semiconductor device according to the design information. Fabricating the semiconductor device includes forming a spacer on an exposed side portion of a magnetic tunnel junction (MTJ) device during formation of the MTJ device. Fabricating the semiconductor device further includes forming an etch-resistant protective coating associated with the MTJ device during formation of the MTJ device.

One particular advantage provided by at least one of the disclosed embodiments is the protection of a spacer against wear due to etching. In embodiments where the spacer blocks redeposition material from coming in close proximity to layers of an MTJ device, protecting the spacer from wear may prevent the formation of a shunt path between one or more of the layers of the MTJ device. Thus, the manufacture of defective MTJ devices may be reduced as compared to processes that do not use an etch-resistant protective coating.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1A:
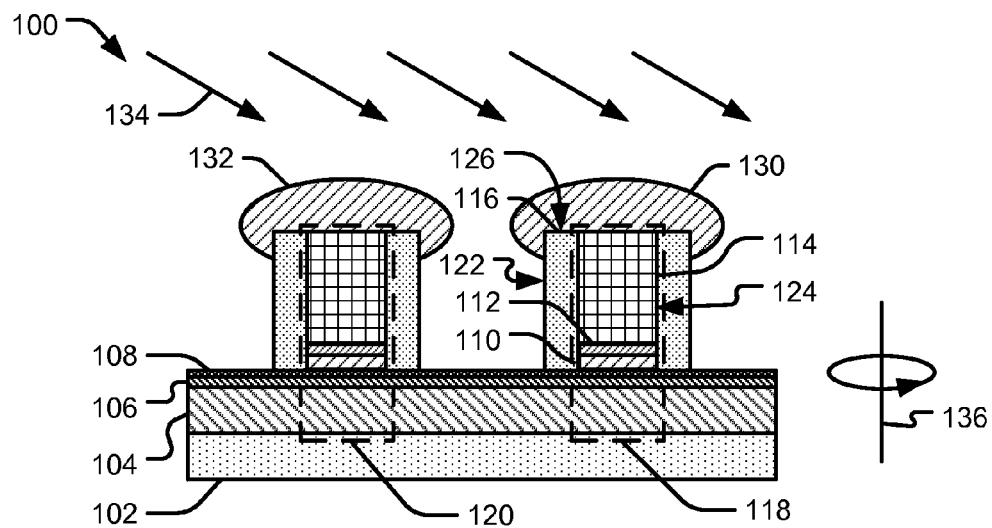
FIG. 1A is an illustrative diagram of a device during a first stage of a first embodiment of a method of forming an etch-resistant protective coating on the device.
Figure 1B:
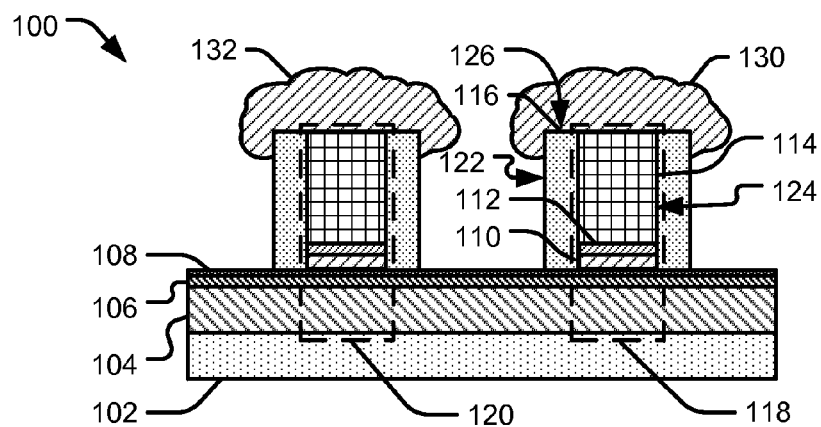
FIG. 1B is an illustrative diagram of a device during a second stage of the first embodiment of a method of forming an etch-resistant protective coating on the device.
Figure 1C:
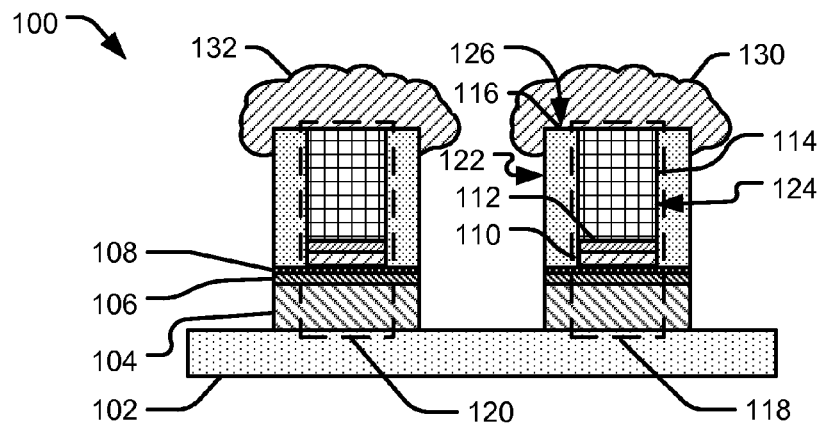
FIG. 1C is an illustrative diagram of a device during a third stage of the first embodiment of a method of forming an etch-resistant protective coating on the device.

Referring to FIG. 1A-FIG. 1C, a device 100 is depicted at multiple stages of a first embodiment of a method of forming an etch-resistant protective coating on the device 100. The device 100 may correspond to a magnetic tunnel junction (MTJ) array.

The device 100 may include a substrate 102, a bottom electrode layer 104, a reference layer 106, a tunnel barrier layer 108, a storage layer 110, a top electrode layer 112, and a conductive hard mask layer 114. The device 100 may include a first MTJ device 118 and a second MTJ device 120. A spacer 116 may be formed on a side portion of the first MTJ device 118. As depicted FIG. 1A-FIG. 1C, the etch-resistant protective coating may include a protective crown 130 (e.g., a metal crown). The protective crown 130 may protect the spacer 116 from wear during an etch process at the device 100, thus enabling the spacer 116 to prevent redeposition material from coming in contact with a sidewall of the first MTJ device 118.

Referring to FIG. 1A, during a first stage of the multiple stages, the storage layer 110, the top electrode layer 112, and the conductive hard mask layer 114 may be etched to define (or "etch out") a first portion of the first MTJ device 118. The first portion of the first MTJ device 118 may include the storage layer 110, the top electrode layer 112, and the conductive hard mask layer 114. A second portion of the first MTJ device 118 may include the bottom electrode layer 104, the reference layer 106, and the tunnel barrier layer 108. The second portion of the first MTJ device 118 may be defined (e.g., "etched out" using an etch process) at a later stage of fabricating the device 100, as described with reference to FIG. 1C. The second MTJ device 120 may be formed in a similar manner as described with reference to the first MTJ device 118 and may include structures corresponding to structures of the first MTJ device 118. In a particular embodiment, the device 100 includes an MTJ array (e.g., a high density MTJ array) including many MTJ devices within an area of the device 100. For example, a height to space ratio of the MTJ array may be greater than or equal to 1.0.

After defining the first portion of the first MTJ device 118, the spacer 116 may be formed on an exposed sidewall 124 of the first MTJ device 118. The exposed sidewall 124 may include an exposed portion of the storage layer 110, an exposed portion of the top electrode layer 112, an exposed portion of the conductive hard mask layer 114, or any combination thereof. The spacer 116 may include a dielectric. For example, the spacer 116 may include silicon nitride, silicon oxide, another type of dielectric, or any combination thereof. To illustrate, during the first stage of the process, a dielectric layer may be deposited conformally on the device 100. The dielectric layer may be etched (e.g., with high anisotropy) to define the spacer 116. The spacer 116 may prevent redeposition material from coming in close proximity or from coming in contact with the exposed sidewall 124 of the first MTJ device 118, thus preventing a shunt path from forming at the first MTJ device 118.

After the spacer 116 is formed, an etch-resistant protective coating may be applied to the spacer 116. For example, a directional deposition process 134 may be applied to the device 100 during a repositioning of the device 100. The directional deposition process 134 may include any directional deposition process usable to deposit an etch-resistant material (e.g., a metal) on the device 100. For example, the directional deposition process may include an ion beam deposition process, an evaporation process, another type of directional deposition process, or any combination thereof.

The repositioning may include rotating the device 100 using a rotation operation 136 while tilting the device 100. In a particular embodiment, the rotation operation 136 includes rotating a wafer that includes the device 100. The repositioning of the device 100 during the directional deposition process 134 results in the formation of the protective crown 130 on a top surface 126 of the spacer 116 and on an upper portion of a sidewall 122 of the spacer 116. To illustrate, the directional deposition process 134 may be used to deposit a metal on the device 100. Because the first MTJ device 118 and the second MTJ device 120 are located within a particular distance, a "shadow" effect may cause the metal to accumulate near top regions of the first MTJ device 118 and the second MTJ device 120 instead of between the first MTJ device 118 and the second MTJ device 120. For example, a "shadow" of the second MTJ device 120 may inhibit the directional deposition process 134 from depositing metal on the lower portion of the sidewall 122 of the spacer 116. Instead, the metal may accumulate on the upper portion of the sidewall 122, as illustrated. As a result, the protective crown 130 may be formed. Similarly, a protective crown may be formed on each MTJ device of the MTJ array. For example, a second protective crown 132 may be formed on the second MTJ device 120.

The protective crown 130 and the second protective crown 132 may include any metal suitable for protecting the spacer 116 during etching as described herein. For example, the protective crown 130 may include tantalum, aluminum, another etch resistant metal, or any combination thereof. Forming protective crowns at each MTJ device of the MTJ array may protect spacers from wearing at each of the MTJ devices. Thus, the spacers may reduce or prevent redeposition material from reaching the first MTJ device 118 and second MTJ device 120.

FIG. 1B depicts the device 100 during a second stage of the process. During the second stage of the process, the protective crown 130 may be chemically modified to further increase an etch-resistance of the protective crown 130. For, example, the protective crown 130 may be oxidized using an oxidation process. The increased etch-resistance may enable the protective crown 130 to resist an etch process that would otherwise cause wear to the spacer 116. For example, the etch process may include a noble-gas-based etch process (e.g., an argon-based process, a krypton-based process, etc.), an organic-compound-based etch process, a chlorine-based etch process, another etch process that may be resisted by the protective crown 130, or any combination thereof. Thus, during the first stage and the second stage, the protective crown 130 may be formed on the spacer 116 and oxidized. After being oxidized, the protective crown 130 may provide greater etch-resistance than the spacer 116. Similarly, an oxidized protective crown may be formed at each MTJ device of the MTJ array. For example, the second protective crown 132 may be formed and oxidized to increase an etch-resistance of the second protective crown 132.

FIG. 1C depicts the device 100 during a third stage, where the bottom electrode layer 104, the reference layer 106, and the tunnel barrier layer 108, may be etched to complete formation of the first MTJ device 118 and to complete formation of the second MTJ device 120. The protective crown 130 may be more resistant to etching than the sidewall 122 of the spacer 116, thereby protecting the spacer 116 during the etching. Each MTJ device of the MTJ array may be defined and completed in a similar manner as the first MTJ device 118 and the second MTJ device 120. As the bottom electrode layer 104, the reference layer 106, and the tunnel barrier layer 108 are etched, redeposition material may form on the spacer 116. The redeposition material may be prevented from coming in contact with the sidewall 124 of the first MTJ device 118 by the spacer 116.

During formation of the first MTJ device 118, the protective crown 130 may provide etch-resistance and may prevent wearing of the spacer 116. To illustrate, because the protective crown 130 is attached to the top surface 126 and to the upper portion of the sidewall 122 of the spacer 116, the protective crown may prevent tapering of the spacer 116 during the formation of other portions of the first MTJ device 118. After the first MTJ device 118 is formed, the protective crown 130 and the second protective crown 132 may be removed. For example, a planarization process may be performed at the device 100 to planarize the first MTJ device 118 and the second MTJ device 120 to remove the protective crown 130 and the second protective crown 132. By preventing tapering of the spacer 116, the protective crown 130 may prevent the redeposition material from forming a shunt path at the first MTJ device 118, which may reduce performance at the first MTJ device 118.

Referring to FIG. 2A-FIG. 2D, a device 200 is depicted at multiple stages of a second embodiment of a process of forming an etch-resistant protective coating. The device 200 may correspond to the device 100 of FIG. 1A-FIG. 1C. As with the protective crown 130 of FIG. 1A-FIG. 1C, the etch-resistant protective coating may protect the spacer 116 from wear during an etch process at the device 100. However, in the embodiment of FIG. 2A-FIG. 2D, the etch-resistant protective coating may be formed without using a directional deposition process and without repositioning of the device 200.

Figure 2A:
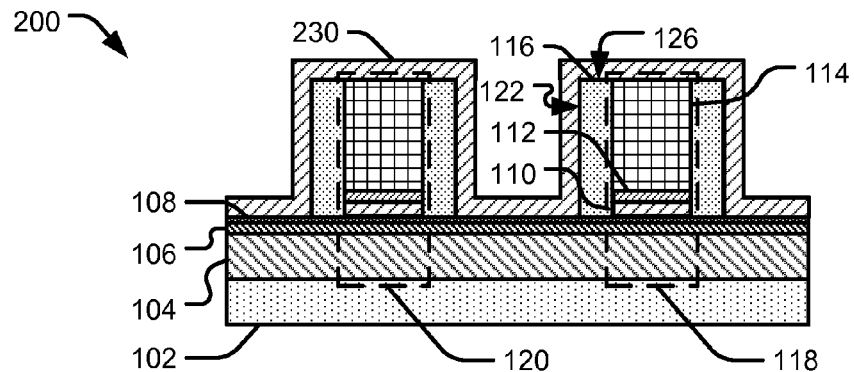
FIG. 2A is an illustrative diagram of a device during a first stage of a second embodiment of a method of forming an etch-resistant protective coating on the device.

Referring to FIG. 2A, a metal layer 230 may be conformally deposited on the tunnel barrier layer 108, on a sidewall 122 of the spacer 116, on the top surface 126 of the spacer 116, and on the conductive hard mask layer 114. The metal layer 230 may include any metal that enables etch resistance. For example, the metal layer 230 may include tantalum, aluminum, another metal that enables etch-resistance, or any combination thereof.

Figure 2B:
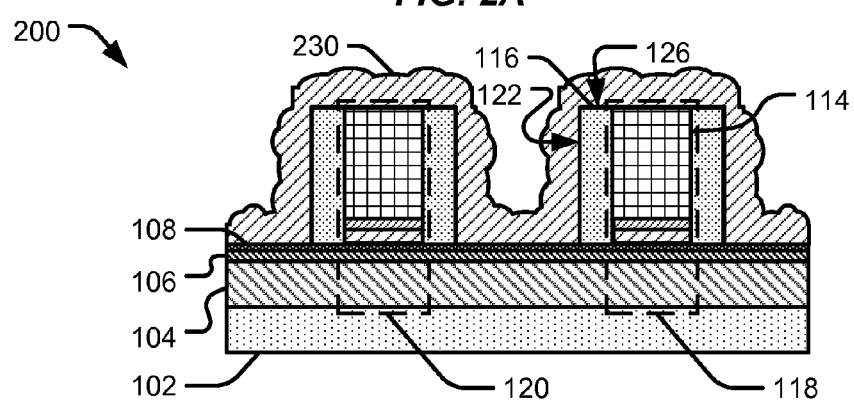
FIG. 2B is an illustrative diagram of a device during a second stage of the second embodiment of a method of forming an etch-resistant protective coating on the device.

Referring to FIG. 2B, the metal layer 230 may be chemically modified (e.g., oxidized) to increase a resistance to an etching process. For example, the metal layer 230 may be oxidized using an oxidation process to form tantalum oxide (e.g., Ta2O5), aluminum oxide, another oxidized metal, or any combination thereof. The oxidized metal may increase a resistance to a first etch process used to form the first MTJ device 118. For example, the first etch process may include a noble-gas-based etch process (e.g., an argon-based process, a krypton-based process, etc.), an organic-compound-based etch process, a chlorine-based etch process, another etch process that may be resisted by metal layer 230, or any combination thereof.

Figure 2C:
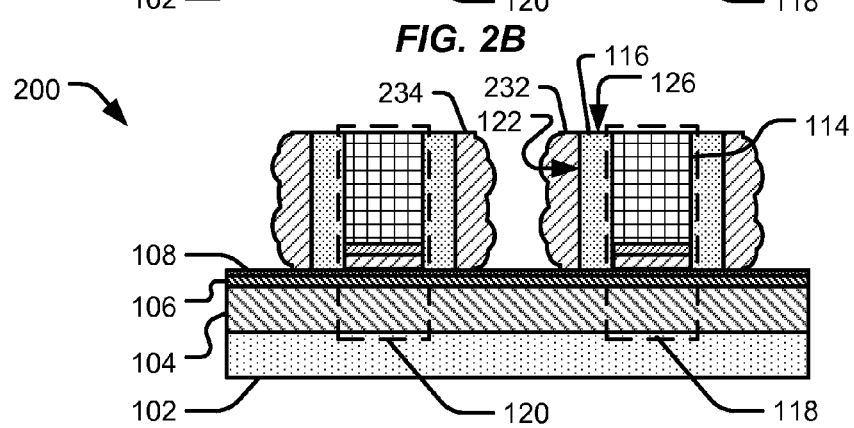
FIG. 2C is an illustrative diagram of a device during a third stage of the second embodiment of a method of forming an etch-resistant protective coating on the device.

Referring to FIG. 2C, the metal layer 230 may be etched to form a protective coating 232 on the spacer 116. For example, the metal layer 230 may be etched using a second etching process. The metal layer 230 may not be resistant to the second etching process, but may be resistant a first etching process used to etch the first MTJ device 118. In an exemplary embodiment, the second etching process may include a fluorine-based etching process (e.g., a process using NF3 or CF4). Thus, the metal layer 230 may be etched using the second etch process while being resistant to the first etch process. The second etch process may result in the protective coating 232 being formed on a sidewall of the spacer 116, such as the sidewall 122. A second protective coating 234 may be formed at the second MTJ device. In an exemplary embodiment, a protective coating is formed at each MTJ device of the MTJ array. Thus, oxidizing the metal layer 230 and etching the metal layer 230 may form an etch-resistant protective coating (e.g., the protective coating 232 and the second protective coating 234).

In an alternative embodiment, the oxidation process described with reference to FIG. 2B may be performed after the etching process described with reference to FIG. 2C. Thus, the protective coating 232 may be formed prior to being oxidized.

Figure 2D:
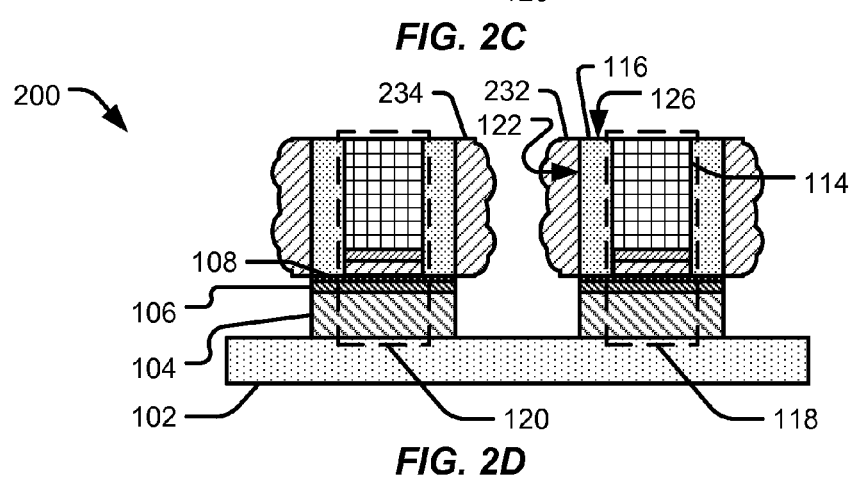
FIG. 2D is an illustrative diagram of a device during a fourth stage of the second embodiment of a method of forming an etch-resistant protective coating on the device.

Referring to FIG. 2D, during the fourth stage of the process, the bottom electrode layer 104, the reference layer 106, and the tunnel barrier layer 108, may be etched (e.g., using the first etch process) to complete the first MTJ device 118 and the second MTJ device 120. The protective coating 232 and the second protective coating 234 may be more resistant to the etching than the sidewall 122 of the spacer 116, thereby protecting the spacer 116 during the first etch process. After the first MTJ device 118 is formed, the protective coating 232 and the second protective coating 234 may be removed. For example, another etching may be performed using the second etch process to remove the protective coating 232 and the second protective coating 234. To illustrate, the second etch process may include a fluorine-based plasma etch process (e.g., a process using NF3 or CF4). An etch anisotropy, or the ratio of material removal from horizontal surfaces and from vertical surfaces, may be tuned (e.g., through chamber pressure, substrate bias power, and/or gas chemistry) to remove the protective coating 232 from the sidewall 122 of the spacer 116. Depending on the particular implementation, the protective coating 232 and the second protective coating 234 may remain in the device 200 (i.e., may not be removed).

By forming the protective coating 232 and the second protective coating 234, the spacer 116 is protected from wear during etching of the bottom electrode layer 104, the reference layer 106, and the tunnel barrier layer 108. Further, the protective coating 232 and the second protective coating 234 may be formed without using a rotation process and without tilting the device 200, resulting in a lower cost of manufacturing the device 200.

Referring to FIG. 3A-FIG. 3D, another embodiment of a process of forming an etch-resistant protective coating is depicted. Referring to FIG. 3A-FIG. 3D, a device 300 is depicted at multiple stages of a third embodiment of a process of forming an etch-resistant protective coating. The device 300 may correspond to the device 100 of FIG. 1A-FIG. 1C and to the device 200 of FIG. 2A-FIG. 2D. For example, the device 300 may include the substrate 102, the bottom electrode layer 104, the reference layer 106, the tunnel barrier layer 108, the storage layer 110, the top electrode layer 112, and the conductive hard mask layer 114, the first MTJ device 118, the second MTJ device 120, and the spacer 116. In the particular embodiment described with reference to FIG. 3A-FIG. 3D, an etch-resistant protective coating may be formed using an ion (e.g., carbon) implantation process applied to a silicon-based layer. Alternatively or in addition, the ion implantation process may be applied directly to the spacer 116 to form an etch-resistant protective coating. By forming the etch-resistant protective coating using a silicon-based layer or by applying the ion implantation process to the spacer, a metal layer need not be deposited as depicted with reference to FIG. 2A-FIG. 2D.

Figure 3A:
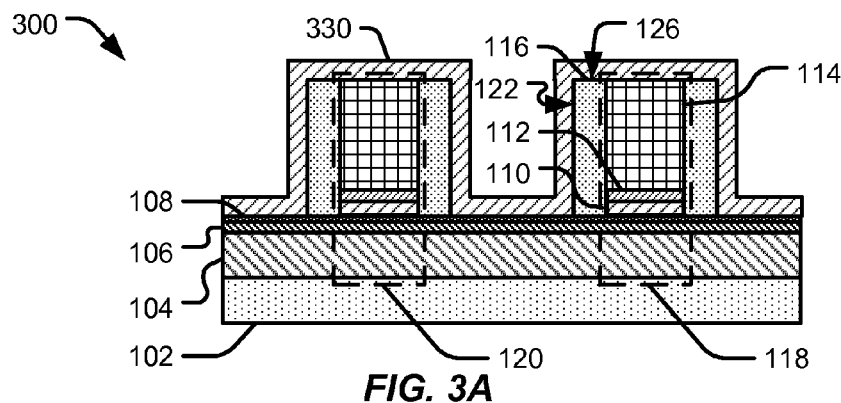
FIG. 3A is an illustrative diagram of a device during a first stage of a third embodiment of a method of forming an etch-resistant protective coating on the device.

Referring to FIG. 3A, at a first stage of the process, a silicon-based layer 330 may be conformally deposited on the device 300. For example, the silicon-based layer 330 may be applied to the tunnel barrier layer 108, to the spacer 116, and to the conductive hard mask layer 114. The silicon-based layer 330 may include any non-metal material suitable for resisting an etch process as described herein. For example, the silicon-based layer may include silicon nitride, silicon oxide, another non-metal, or any combination thereof.

Figure 3B:
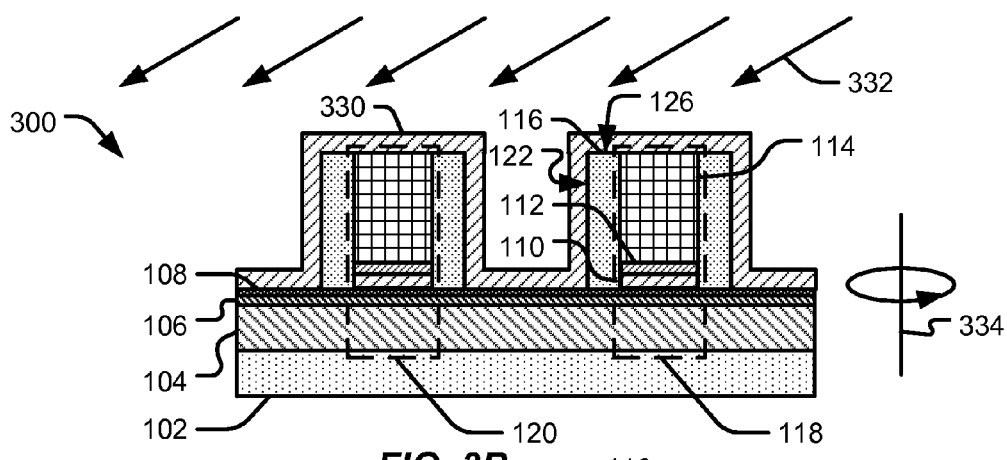
FIG. 3B is an illustrative diagram of a device during a second stage of the third embodiment of a method of forming an etch-resistant protective coating on the device.

Referring to FIG. 3B, an ion (e.g., carbon) implantation process 332 may be applied to the silicon-based layer 330 during a rotation process 334. The carbon implantation process 332 may increase an etch-resistance of the silicon-based layer 330 to a first etching process. For example, implanting the silicon-based layer 330 with carbon may increase a cohesive strength of the silicon-based layer 330, rendering the silicon-based layer 330 stronger and more resistant to the first etching process. In a high-density MTJ array, only a top surface and a topmost portion of the silicon-based layer 330 may receive substantial implantation due to the "shadowing" of neighbor devices, as described with reference to the directional deposition process 134 of FIG. 1A. For example, a "shadow" of the second MTJ device 120 may inhibit the carbon implantation process 332 from implanting material at the lower portion of the sidewall 122 of the spacer 116. Further, implanting the silicon-based layer 330 with carbon may decrease reactance of the silicon-based layer 330 to materials used during the first etching process. The first etching process may include any etching process usable to define (or "etch out") one or more regions of the device 300. For example, the first etching process may include a noble-gas-based plasma etching process, an organic compound-based etching process, a chlorine-based etching process, another etching process, or any combination thereof.

Figure 3C:
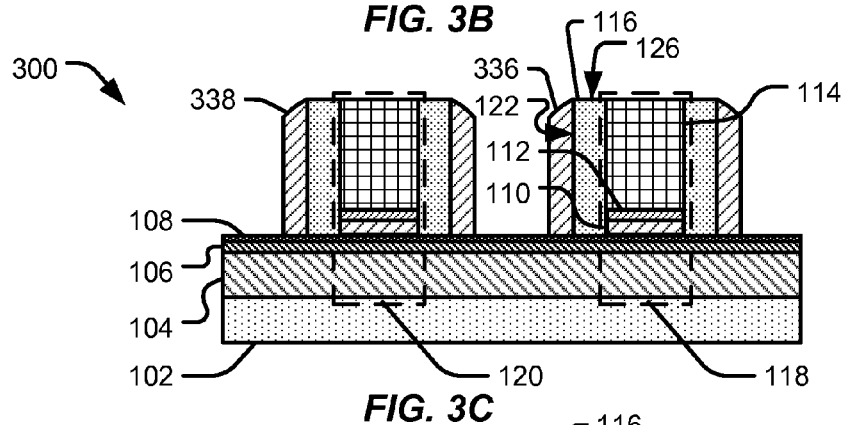
FIG. 3C is an illustrative diagram of a device during a third stage of the third embodiment of a method of forming an etch-resistant protective coating on the device.

Referring to FIG. 3C, the silicon-based layer 330 may be etched using a second etching process. For example, the second etching process may include a fluorine-based plasma etching process. The silicon-based layer 330 may not be etch-resistant to the second etching process (or may have less etch resistance to the second etch process than to the first etch process). During the third stage of the process, the silicon-based layer 330 may be etched using the second etching process to define a protective coating 336. The protective coating 336 may be formed on the sidewall 122 of the spacer 116. The protective coating 336 may protect the spacer 116 from wear during formation of the first MTJ device 118. A second protective coating 338 may be formed at the second MTJ device 120. In an embodiment, protective coatings are formed at each MTJ device of the array of MTJ devices.

In an alternative embodiment, the carbon implantation process 332 described with reference to FIG. 3B may be performed after the etching process described with reference to FIG. 3C. Thus, the protective coating 336 may be formed prior to being carbon implanted. In another embodiment, the spacer 116 may be modified by performing the implantation process 332 described with reference to FIG. 3B directly on the spacer 116 to enhance resistance to an etch process. For example, by applying the carbon implantation process 332 to the spacer 116, an etch-resistant protective coating may be formed. The etch-resistant protective coating may have a greater etch resistance relative to the spacer 116 (prior to applying the carbon implantation process 332 to the spacer 116).

Figure 3D:
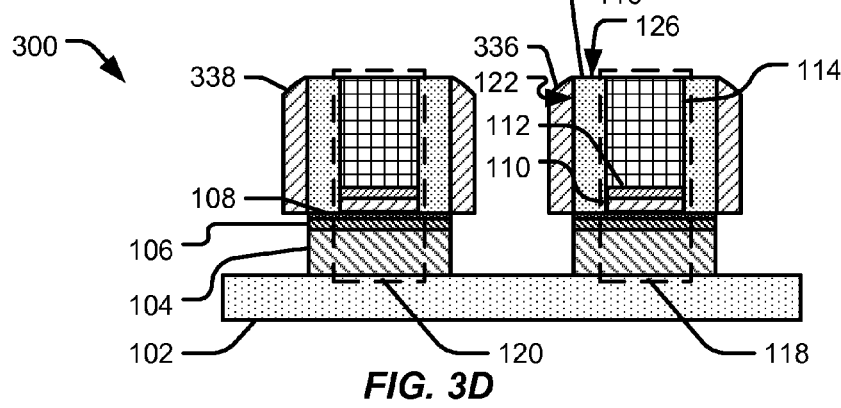
FIG. 3D is an illustrative diagram of a device during a fourth stage of the third embodiment of a method of forming an etch-resistant protective coating on the device.

Referring to FIG. 3D, the bottom electrode layer 104, the reference layer 106, and the tunnel barrier layer 108 may be etched using the first etching process to complete the first MTJ device 118. The protective coating 336 and the second protective coating 338 may be more resistant to the second etch process than the sidewall 122 of the spacer 116, thereby protecting the spacer 116 during the etching process. Similarly, formation of the second MTJ device 120 may be completed. After the first MTJ device 118 is formed, the protective coating 336 and the second protective coating 338 may be removed (e.g., using an etch process).

By forming the protective coating 336 and the second protective coating 338, the spacer 116 may be protected from wear during etching of the bottom electrode layer 104, the reference layer 106, and the tunnel barrier layer 108. Further, the protective coating 232 may be formed without depositing additional metal on the device 300.

FIG. 1A-FIG. 3D describe examples of forming etch-resistant protective coatings associated with MTJ devices, where the etch-resistant protective coatings are more etch-resistant to an etch process than the spacers. For example, an etch resistance of the protective crown 130 and the second protective crown 132 of FIG. 1A-FIG. 1C and an etch resistance of the protective coating 232 and the second protective coating 234 of FIG. 2A-FIG. 2D may be increased through oxidization. The oxidization may decrease reactance of the protective crown 130, the second protective crown 132, the protective coating 232, and the second protective coating 234 to materials used during an etch process, such as a noble-gas-based plasma etching process, an organic compound-based etching process, a chlorine-based etching process, another etching process, or any combination thereof. As an additional example, the carbon implantation process 332 of FIG. 3B may increase cohesive strengths of the protective coating 336 and the protective coating 338 of FIG. 3C and FIG. 3D, rendering the protective coating 336 and the protective coating 338 more resistant to the etch process. Further, implanting the silicon-based layer 330 with carbon may decrease reactance of the silicon-based layer 330 to materials used during the etch process. As another example, the carbon implantation process 332 may be directly applied to the spacer 116 to increase a cohesive strength of the spacer 116 and/or to decrease reactance of the spacer 116 to materials used during the etch process.

While different embodiments are depicted with reference to FIG. 1A-FIG. 3D, it should be noted that the embodiments may be combined to form combinations of etch-resistant protective coatings. For example, after forming the protective coating 232 as described with reference to FIG. 2C, a protective crown as described with reference to FIG. 1A may be formed on the spacer 116 and on the protective coating 232. Both the protective crown and the protective coating 232 may be oxidized to produce a finalized etch-resistant protective coating.

Figure 4:
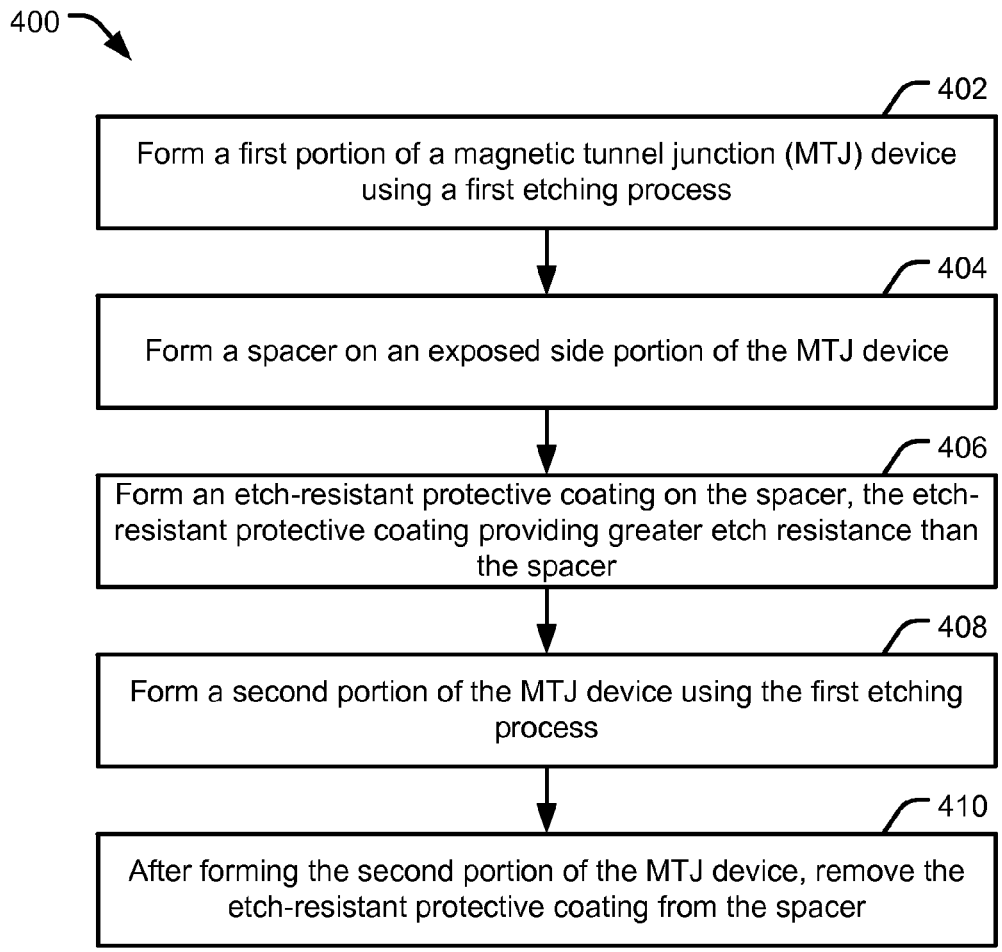
FIG. 4 is a flow diagram of an embodiment of a method of forming an etch-resistant protective coating.

Referring to FIG. 4, a method of forming a magnetic tunnel junction (MTJ) device is disclosed and generally designated 400. The method 400 may include forming a first portion of the MTJ device using a first etching process, at 402. For example, referring to FIG. 1A-FIG. 3D, the storage layer 110, the top electrode layer 112, and the conductive hard mask layer 114, may be etched using a first process to form a first portion of the first MTJ device 118.

The method 400 may further include forming a spacer on an exposed side portion of the MTJ device, at 404. For example, the spacer 116 may be formed on the sidewall 124 of the first MTJ device 118 as depicted in FIG. 1A-FIG. 3D.

The method 400 may also include forming an etch-resistant protective coating associated with the MTJ device, the etch-resistant protective coating providing greater etch-resistance than the spacer, at 406. For example, the protective crown 130 may be formed on the top surface 126 and on an upper portion of a sidewall 122 of the spacer 116 as depicted in FIG. 1A-FIG. 1C. In another embodiment, the protective coating 232 may be formed on a sidewall of the spacer 116, as depicted in FIG. 2A-FIG. 2D. In another embodiment, the silicon-based protective coating 336 may be formed on the spacer 116. The silicon-based protective coating 336 may be subjected to a carbon implantation process 332 to increase an etch-resistance of the silicon-based protective coating 336 to the first etching process. In another embodiment, the carbon implantation process 332 may be applied directly to the spacer 116 to form the etch-resistant protective coating.

The method 400 includes forming a second portion of the MTJ device using the first etching process, at 408. For example, a completed portion of the first MTJ device 118 may be formed using the first etching process. The completed portion may include the bottom electrode layer 104, the reference layer 106, and the tunnel barrier layer 108.

In an embodiment where an etch-resistant protective coating is formed on the spacer, the method 400 may optionally include, after forming the second portion of the MTJ device, removing the etch-resistant protective coating from the spacer. For example, after completing formation of the first MTJ device 118, the etch-resistant protective coating (e.g., of FIG. 2A-2D, of FIG. 1A-1C, of FIG. 3A-3D), may be removed using an etch process. Alternatively, depending on the particular fabrication process and/or device characteristics, the etch-resistant protective coating may not be removed from the spacer. In this case, the MTJ device may include (or may be connected to) the etch-resistant protective coating.

By forming an etch-resistant protective coating that provides greater etch resistance than a spacer, an etch process may be performed with less wear to the spacer. Thus, an MTJ device may be fabricated with less wear to a spacer connected to the MTJ device. As such, the risk of redeposition material forming a shunt path on the MTJ device due to wearing of the spacer is reduced. One or more operations of the method 400 may be repeated one or more times based on device structure of the MTJ device and/or based on one or more materials used to form the MTJ device. For example, an etch process may be repeated to further define one or more structures of the MTJ device. In this case, one or more additional etch-resistant protective coatings may be applied to the MTJ device to protect one or more regions of the MTJ device during the etch process, as an illustrative example.

Figure 5:
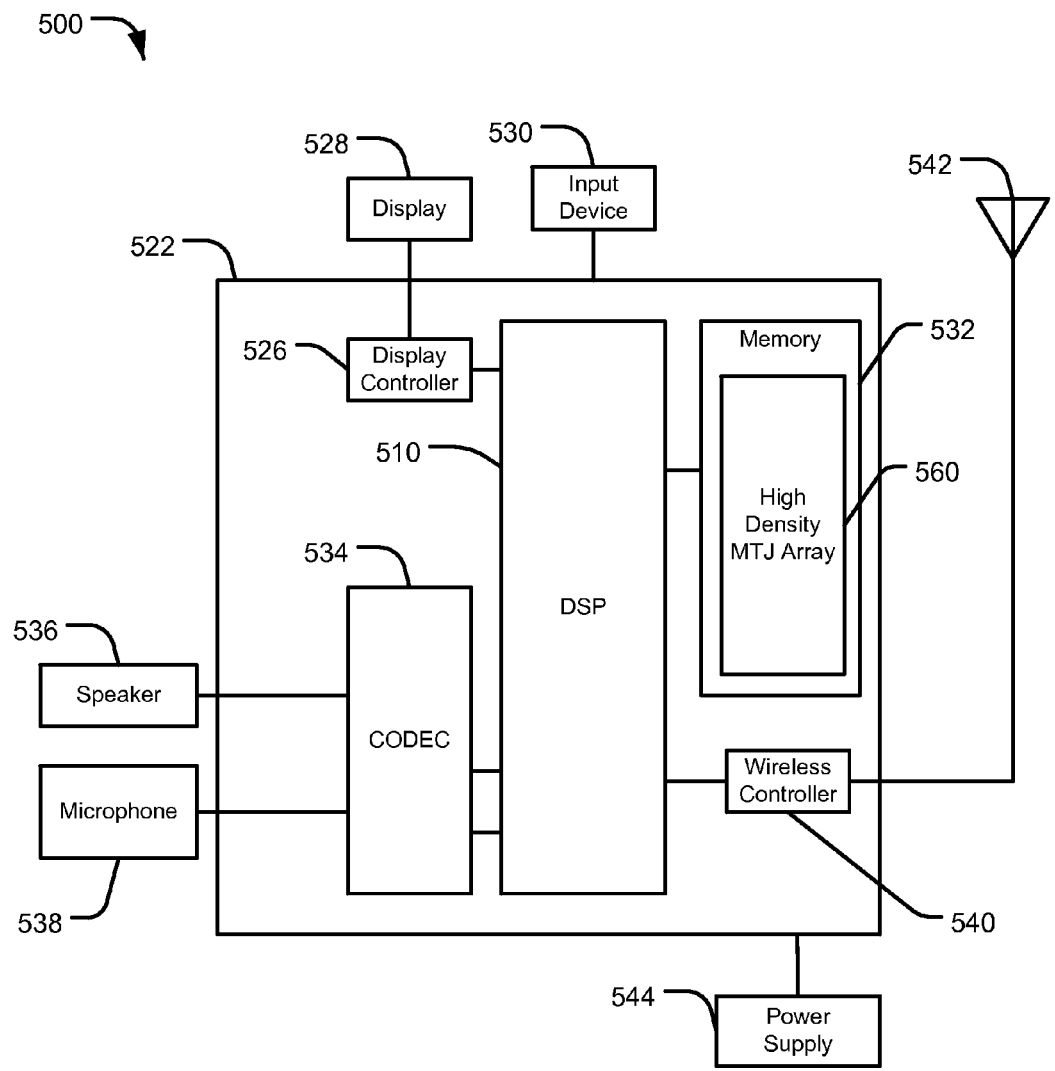
FIG. 5 is a block diagram of an electronic device including a device formed according to a process that uses an etch-resistant protective coating.

A memory fabricated using the method 400 may be included in an electronic device, as described further with reference to FIG. 5.

Referring to FIG. 5, a block diagram of a particular illustrative embodiment of an electronic device, such as a wireless communication device, is depicted and generally designated 500. The electronic device 500 includes a processor, such as a digital signal processor (DSP) 510, coupled to a memory 532. The memory 532 may include a high density MTJ array 560 that includes a plurality of MTJ devices. Each of the plurality of MTJ devices may be formed using the method 400 of FIG. 4.

For example, the plurality of MTJ devices may include an MTJ device that is formed using an etch-resistant protective coating associated with the MTJ device. To illustrate, the MTJ device may include an electrode, such as the top electrode layer 112 of FIG. 1A-FIG. 3D. The MTJ device may further include a storage layer, such as the storage layer 110 of FIG. 1A-FIG. 3D. The MTJ device may be formed using a process that includes forming a spacer, such as the spacer 116 of FIG. A1-FIG. 3D, on an exposed side portion of the electrode and on an exposed side portion of the storage layer. The process may further include forming an etch-resistant protective coating associated with the MTJ device. For example, an etch-resistant protective coating may be formed on the spacer. The etch-resistant protective coating may include the protective crown 130 of FIG. 1A-FIG. 1C, the protective coating 232 of FIG. 2A-FIG. 2D, and/or the protective coating 336 of FIG. 3A-FIG. 3D. Depending on the particular implementation, the etch-resistant protective coating may be removed (or substantially removed) from the high density MTJ array 560 (e.g., using an etch process) during fabrication of the high density MTJ array 560. In one or more other implementations, the etch-resistant protective coating is not removed from the high density MTJ array 560. In this case, the high density MTJ array 560 may include the etch-resistant protective coating. As an illustrative example, the ion implantation process 332 may be applied to the spacer 116 to form an etch-resistant protective coating, and the high density MTJ array 560 may include the etch-resistant protective coating (because the etch-resistant protective coating is not removed from the high density MTJ array 560 in this example).

FIG. 5 also shows a display controller 526 that is coupled to the digital signal processor 510 and to a display 528. A coder/decoder (CODEC) 534 can also be coupled to the digital signal processor 510. A speaker 536 and a microphone 538 can be coupled to the CODEC 534.

FIG. 5 also indicates that a wireless controller 540 can be coupled to the digital signal processor 510 and to an antenna 542. In a particular embodiment, the DSP 510, the display controller 526, the memory 532, the CODEC 534, and the wireless controller 540 are included in a system-in-package or system-on-chip device 522. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the antenna 542, and the power supply 544 are external to the system-on-chip device 522. However, each of the display 528, the input device 530, the speaker 536, the microphone 538, the antenna 542, and the power supply 544 can be coupled to a component of the system-on-chip device 522, such as an interface or a controller.

In conjunction with the described embodiments, a system is disclosed that may include means for preventing redeposition material from coming in close proximity or in contact with an exposed sidewall of an MTJ device, such as the spacer 116 of FIG. 1A-FIG. 3D, one or more other devices or circuits configured to prevent redeposition material from coming in close proximity or in contact with an exposed sidewall of an MTJ device, or any combination thereof. The system may also include means for protecting the means for preventing redeposition material from coming in close proximity or in contact with an exposed sidewall of an MTJ device from wear during an etch process. The means for protecting may include the protective crown 130 of FIG. 1C, the protective coating 232 of FIG. 2D, the protective coating 336 of FIG. 3D, one or more other structures or layers configured to protect the means for preventing redeposition material from coming in close proximity or in contact with an exposed sidewall of an MTJ device from wear during an etch process, or any combination thereof.

Figure 6:
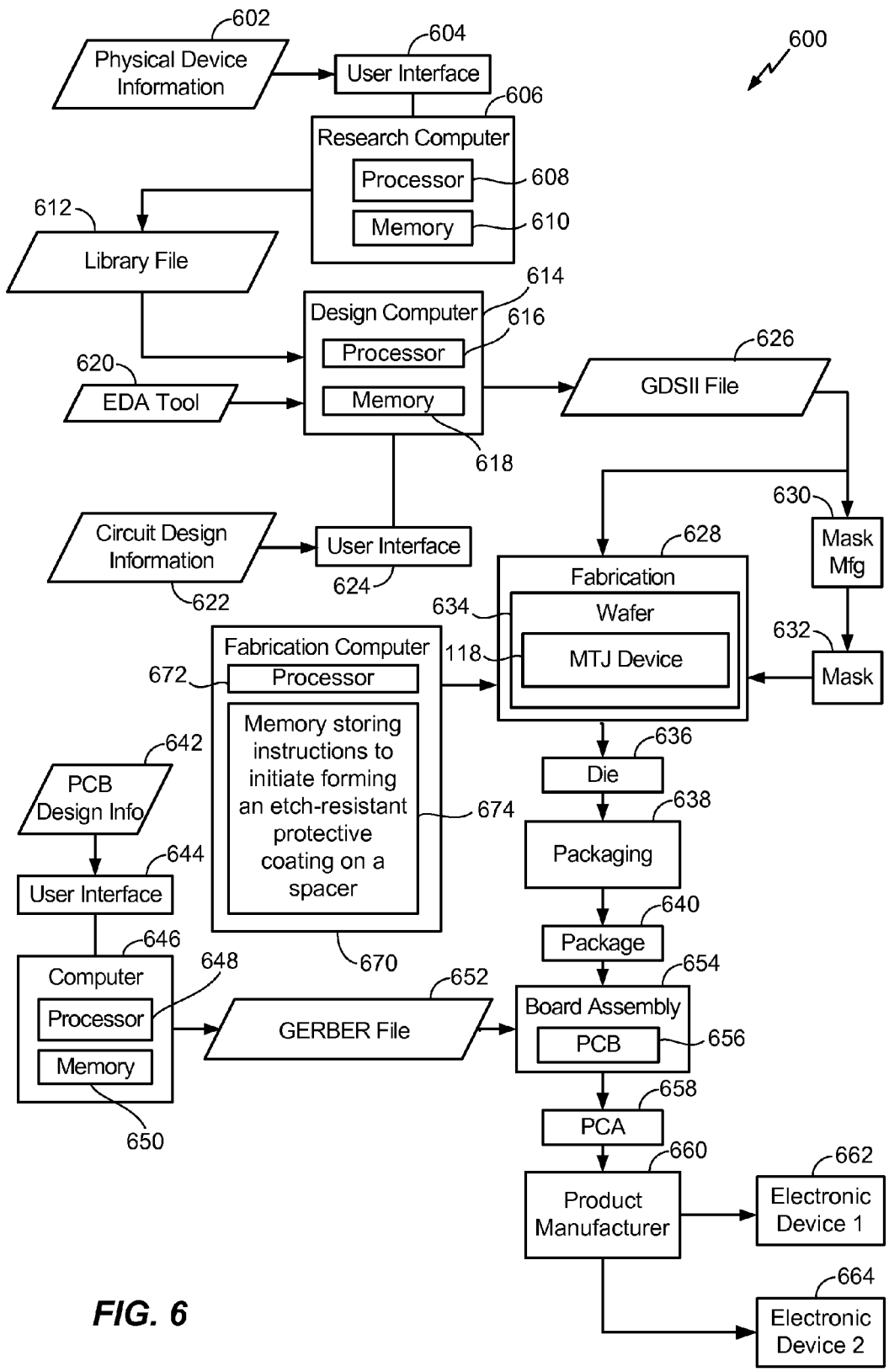
FIG. 6 is a data flow diagram of an embodiment of a manufacturing process to manufacture electronic devices according to a process that uses an etch-resistant protective coating.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 6 depicts a particular illustrative embodiment of an electronic device manufacturing process 600.

Physical device information 602 is received at the manufacturing process 600, such as at a research computer 606. The physical device information 602 may include design information representing at least one physical property of a semiconductor device, such as the first MTJ device 118 of FIG. 1A-FIG. 3D, the second MTJ device 120, or any combination thereof. For example, the physical device information 602 may include physical parameters, material characteristics, and structure information that is entered via a user interface 604 coupled to the research computer 606. The research computer 606 includes a processor 608, such as one or more processing cores, coupled to a computer readable medium such as a memory 610. The memory 610 may store computer readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of semiconductor devices including a device that includes the first MTJ device 118 of FIG. 1A-FIG. 3D, the second MTJ device 120, or any combination thereof, that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a circuit including the first MTJ device 118 of FIG. 1A-FIG. 3D, the second MTJ device 120, or any combination thereof, of the library file 612. For example, a user of the design computer 614 may enter circuit design information 622 via a user interface 624 coupled to the design computer 614. The circuit design information 622 may include design information representing at least one physical property of a semiconductor device, such as the first MTJ device 118 of FIG. 1A-FIG. 3D, the second MTJ device 120, or any combination thereof. To illustrate, the circuit design property may include identification of particular circuits and relationships to other elements in a circuit design, positioning information, feature size information, interconnection information, or other information representing a physical property of a semiconductor device.

The design computer 614 may be configured to transform the design information, including the circuit design information 622, to comply with a file format. To illustrate, the file formation may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing the first MTJ device 118 of FIG. 1A-FIG. 3D, the second MTJ device 120, or any combination thereof, in addition to other circuits or information. To illustrate, the data file may include information corresponding to a system-on-chip (SOC) that includes the first MTJ device 118 of FIG. 1A-FIG. 3D, the second MTJ device 120, or a combination thereof, and that also includes additional electronic circuits and components within the SOC.

The GDSII file 626 may be received at a fabrication process 628 to manufacture the first MTJ device 118 of FIG. 1A-FIG. 3D, the second MTJ device 120, or any combination thereof, according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 634. The first MTJ device 118 of FIG. 1A-FIG. 3D, the second MTJ device 120, or a combination thereof, may be formed on the one or more wafers 634 using one or more methods and/or processes described with reference to FIG. 1A-FIG. 3D. For example, the one or more wafers 634 may include the device 100 of FIG. 1A-FIG. 1C, the device 200 of FIG. 2A-FIG. 2D, or the device 300 of FIG. 3A-FIG. 3D. The one or more wafers 634 may include the MTJ device.

The fabrication process 628 may be implemented by a fabrication system that is fully automated or partially automated. For example, the fabrication process 628 may be automated according to a schedule. The fabrication system may include fabrication equipment (e.g., processing tools) to perform one or more operations to form a semiconductor device. For example, the fabrication equipment may be configured to perform a directional deposition process, reposition (e.g. rotate) the wafer 634, deposit one or more materials, apply a noble-gas-based etching process, apply an organic-compound-based etching process, apply a chlorine-based etching process, apply a fluorine based etching process, etc.

The fabrication system (e.g., an automated system that performs the fabrication process 626) may have a distributed architecture (e.g., a hierarchy). For example, a fabrication computer 670 may be used during the fabrication process 628. The fabrication computer 670 may include one or more processors, such as a processor 672, one or more memories, such as a memory 674, and/or controllers that are distributed according to the distributed architecture. The distributed architecture may include a high-level processor that controls or initiates operations of one or more low-level systems. For example, a high-level portion of the fabrication process 628 may be initiated by one or more processors, such as the processor 672, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level system. Each of the one or more low-level systems may be associated with one or more corresponding pieces of fabrication equipment (e.g., processing tools). In a particular embodiment, the fabrication system may include multiple processors that are distributed in the fabrication system.

Alternatively, the fabrication computer 670 may initiate operations at a high-level system, subsystem, or component of the fabrication system. In another embodiment, the fabrication computer 670 performs distributed processing at various levels and components of a fabrication system.

The memory 674 may include processor-executable instructions that, when executed by the processor 672, cause the processor 672 to initiate operations during formation of an MTJ device (e.g., the first MTJ device 118). The operations may include forming a spacer on an exposed side portion of the first MTJ device 118. The operations may further include forming an etch resistant protective coating (e.g., the protective crown 130 of FIG. 1A-FIG. 1C, the protective coating 232 of FIG. 2A-FIG. 2D, and/or the protective coating 336 of FIG. 3A-FIG. 3D) associated with the MTJ device.

In a particular embodiment, the memory 674 is a non-transitory computer-readable medium storing computer-executable instructions that are executable by the processor 672 to cause the processor 672 to initiate operations during formation of the first MTJ device 118. The operations may include forming a spacer on an exposed side portion of the first MTJ device 118. The operations may further include forming an etch resistant protective coating (e.g., the protective crown 130 of FIG. 1A-FIG. 1C, the protective coating 232 of FIG. 2A-FIG. 2D, the protective coating 336 of FIG. 3A-FIG. 3D) associated with the MTJ device.

As an illustrative example, the processor 672 may initiate or control (e.g., using a first step) forming a first portion of an MTJ device using a first etching process. For example, the processor 672 may be coupled to one or more controllers that control one or more pieces of fabrication equipment to perform the first step for forming the first portion of the MTJ device using the first etching process. The processor 672 may control the first step for forming the first portion of the MTJ device using the first etching process as described in the method 400 of FIG. 4, at 402.

The processor 672 may also initiate or control (e.g., using a second step) forming a spacer on an exposed side portion of the MTJ device. For example, the processor 672 may be coupled to one or more controllers that control one or more pieces of fabrication equipment to perform the second step for forming the spacer on the exposed side portion of the MTJ device. The processor 672 may control forming the spacer on the exposed side portion of the MTJ device by controlling one or more processes as described in the method 400 of FIG. 4, at 404.

The processor 672 may also initiate or control (e.g., using a third step) forming an etch-resistant protective coating associated with the MTJ device. For example, the processor 672 may be coupled to one or more controllers that control one or more pieces of fabrication equipment to perform the third step for forming an etch-resistant protective coating. The processor 672 may control forming an etch-resistant protective coating by controlling one or more processes as described in the method 400 of FIG. 4, at 406.

The processor 672 may also initiate or control (e.g., using a fourth step) forming a second portion of the MTJ device using the first etching process. For example, the processor 672 may be coupled to one or more controllers that control one or more pieces of fabrication equipment to perform the fourth step for forming the second portion of the MTJ device using the first etching process. The processor 672 may control forming the second portion of the MTJ device using the first etching process by controlling one or more processes as described in the method 400 of FIG. 4, at 408.

The processor 672 may also initiate or control (e.g., using a fifth step) removing the etch-resistant protective coating from the spacer. For example, the processor 672 may be coupled to one or more controllers that control one or more pieces of fabrication equipment to perform the fifth step for removing the etch-resistant protective coating from the spacer. The processor 672 may initiate or control removing the etch-resistant protective coating from the spacer by controlling one or more processes as described in the method 400 of FIG. 4, at 410.

The one or more wafers 634 may be tested and separated into dies, such as a representative die 636. The die 636 includes a circuit including a device that includes the first MTJ device 118 of FIG. 1A-FIG. 3D, the second MTJ device 120, or any combination thereof.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board, the packaged semiconductor device corresponding to the package 640 including the first MTJ device 118 of FIG. 1A-FIG. 3D, the second MTJ device 120, or any combination thereof.

The computer 646 may be configured to transform the PCB design information 642 to generate a data file, such as a GERBER file 652 with data that includes physical positioning information of a packaged semiconductor device on a circuit board, as well as layout of electrical connections such as traces and vias, where the packaged semiconductor device corresponds to the package 640 including the first MTJ device 118 of FIG. 1A-FIG. 3D, the second MTJ device 120, or any combination thereof. In other embodiments, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. As an illustrative, non-limiting example, the first representative electronic device 662, the second representative electronic device 664, or both, may be selected from the group of a set top box, a music player, a video player, an entertainment unit, a navigation device, a communications device, a personal digital assistant (PDA), a fixed location data unit, and a computer, into which the first MTJ device 118 of FIG. 1A-FIG. 3D, the second MTJ device 120 is integrated. As another illustrative, non-limiting example, one or more of the electronic devices 662 and 664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 6 illustrates remote units according to teachings of the disclosure, the disclosure is not limited to these illustrated units. Embodiments of the disclosure may be suitably employed in any device which includes active integrated circuitry including memory and on-chip circuitry.

A device that includes the first MTJ device 118 of FIG. 1A-FIG. 3D, the second MTJ device 120, or any combination thereof, may be fabricated, processed, and incorporated into an electronic device, as described in the illustrative process 600. One or more aspects of the embodiments disclosed with respect to FIGS. 1-5 may be included at various processing stages, such as within the library file 612, the GDSII file 626, and the GERBER file 652, as well as stored at the memory 610 of the research computer 606, the memory 618 of the design computer 614, the memory 650 of the computer 646, the memory 674 of the fabrication computer 670, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or any combination thereof. Although various representative stages of production from a physical device design to a final product are depicted, in other embodiments fewer stages may be used or additional stages may be included. Similarly, the process 600 may be performed by a single entity or by one or more entities performing various stages of the process 600.

In conjunction with the described embodiments, a system is disclosed that may include means for forming a spacer on an exposed side portion of an MTJ device, such as the fabrication computer 670, the fabrication process 628, one or more other devices or circuits configured to form a spacer on an exposed side portion of an MTJ device, or any combination thereof. The system may also include means for forming an etch-resistant protective coating associated with the MTJ device, such as the fabrication computer 670, the fabrication process 628, one or more other devices or circuits configured to form an etch-resistant protective coating, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), a magnetic random access memory (MRAM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of forming a magnetic tunnel junction (MTJ) device, the method comprising:
    forming a spacer on an exposed side portion of the MTJ device; and
    forming an etch-resistant protective coating on a top surface of the spacer and at least a portion of sidewalls of the spacer associated with the MTJ device, the etch-resistant protective coating providing greater etch resistance than the spacer.

2. The method of claim 1, further comprising forming a first portion of the MTJ device.

3. The method of claim 1, further comprising, after forming the etch-resistant protective coating, forming a second portion of the MTJ device.

4. The method of claim 3, wherein forming the second portion of the MTJ device is performed using a noble-gas-based plasma etching process, an organic-compound based etching process, a chlorine based etching process, or any combination thereof.

5. The method of claim 1, wherein forming the etch-resistant protective coating comprises:
    during a directional deposition process, forming a protective crown on the top surface of the spacer, on a top surface of a hard mask layer, and on an upper portion of the sidewalls of the spacer by repositioning a wafer that comprises the MTJ device; and
    oxidizing the protective crown.

6. The method of claim 5, wherein repositioning the wafer comprises tilting the wafer and rotating the wafer.

7. The method of claim 5, wherein the directional deposition process comprises an ion beam deposition process, an evaporation process, or any combination thereof.

8. The method of claim 1, wherein forming the etch-resistant protective coating comprises:
forming a metal layer on the spacer;
chemically modifying the metal layer; and
etching the metal layer, wherein the chemically modifying the metal layer and the etching the metal layer form the etch-resistant protective coating on sidewalls of the spacer.

9. The method of claim 8, wherein chemically modifying the metal layer comprises oxidizing the metal layer using an oxidation process.

10. The method of claim 1, wherein forming the etch-resistant protective coating comprises:
forming a silicon-based layer on the spacer;
performing an ion implantation process on the silicon-based layer; and
etching the silicon-based layer, wherein performing the ion implantation process and the etching form the etch-resistant protective coating on sidewalls of the spacer.

11. The method of claim 10, wherein etching the silicon-based layer is performed using a fluorine-based plasma etching process.

12. The method of claim 10, wherein the silicon-based layer comprises silicon nitride, silicon oxide, or any combination thereof.

13. The method of claim 10, wherein performing the ion implantation process increases an etching resistance of the silicon-based layer.

14. The method of claim 1, wherein forming the etch-resistant protective coating comprises performing an ion implantation process on the spacer to form the etch-resistant protective coating.

15. The method of claim 1, further comprising, after formation of the MTJ device, removing the etch-resistant protective coating from the spacer.

16. An apparatus comprising:
an electrode of a magnetic tunnel junction (MTJ) device; and
a storage layer of the MTJ device,
wherein the MTJ device comprises:
a spacer on an exposed portion of the electrode and on an exposed side portion of the storage layer; and
an etch-resistant protective coating on a top surface of the spacer and at least a portion of sidewalls of the spacer associated with the MTJ device, the etch-resistant protective coating providing greater etch resistance than the spacer.

17. The apparatus of claim 16, wherein the etch-resistant protective coating comprises a protective crown attached to the top of the spacer, on a top surface of a hard mask layer, and to an upper portion of the sidewall of the spacer, a metal layer deposited on the sidewall of the spacer, or a combination thereof.

18. The apparatus of claim 16, wherein the etch-resistant protective coating comprises an ion implanted silicon based layer attached to the sidewall of the spacer.

19. The apparatus of claim 16, wherein the etch-resistant protective coating comprises tantalum oxide, aluminum oxide, or any combination thereof.

20. The apparatus of claim 16, further comprising a high density MTJ array, wherein the high density MTJ array comprises the etch-resistant protective coating and a plurality of MTJ devices, and wherein the plurality of MTJ devices comprises the MTJ device.

21. The apparatus of claim 20, wherein a height to space ratio of the high density MTJ array is greater than 1.0.

22. The apparatus of claim 16, wherein the MTJ device is integrated into an electronic device selected from the group consisting of a set top box, a music player, a video player, an entertainment unit, a navigation device, a communications device, a personal digital assistant (PDA), a fixed location data unit, and a computer.

23. A non-transitory computer readable medium comprising instructions that, when executed by a processor, cause the processor to initiate operations during formation of a magnetic tunnel junction (MTJ) device, the operations comprising:
forming a spacer on an exposed side portion of the MTJ device; and
forming an etch-resistant protective coating on a top surface of the spacer and at least a portion of sidewalls of the spacer associated with the MTJ device, the etch-resistant protective coating providing greater etch resistance than the spacer.

24. The non-transitory computer readable medium of claim 23, wherein forming the etch-resistant protective coating comprises:
during a directional deposition process, forming a protective crown on the top surface of the spacer, on a top surface of a hard mask layer, and on an upper portion of the sidewalls of the spacer by repositioning a wafer that comprises the MTJ device; and
oxidizing the protective crown.

25. The non-transitory computer readable medium of claim 23, wherein forming the etch-resistant protective coating comprises:
forming a metal layer on the spacer;
oxidizing the metal layer; and
etching the metal layer, wherein the oxidizing and the etching form the etch-resistant protective coating on the sidewalls of the spacer.

26. The non-transitory computer readable medium of claim 23, wherein forming the etch-resistant protective coating comprises:
forming a silicon-based layer on the spacer;
performing an ion implantation process on the silicon-based layer; and
etching the silicon-based layer, wherein the ion implantation process and the etching form the etch-resistant protective coating on the sidewalls of the spacer.

27. The non-transitory computer readable medium of claim 23, wherein the operations further comprise, after forming the MTJ device, removing the etch-resistant protective coating from the spacer.

28. A method comprising:
receiving a data file comprising design information corresponding to a semiconductor device; and
fabricating the semiconductor device according to the design information, wherein fabricating the semiconductor device comprises:
during formation of a magnetic tunnel junction (MTJ) device:
forming a spacer on an exposed side portion of an MTJ device; and
forming an etch-resistant protective coating on a top surface of the spacer and at least a portion of sidewalls of the spacer associated with the MTJ device, the etch-resistant protective coating providing greater etch resistance than the spacer.

29. The method of claim 28, further comprising integrating the semiconductor device into a device selected from the group consisting of a set top box, a music player, a video player, an entertainment unit, a navigation device, a communications device, a personal digital assistant (PDA), a fixed location data unit, and a computer.

\* \* \* \* \*